United States Patent
Lechner et al.

(10) Patent No.: US 7,883,924 B2
(45) Date of Patent: Feb. 8, 2011

(54) METHOD FOR PRODUCING A PHOTOVOLTAIC MODULE USING AN IR LASER

(75) Inventors: Peter Lechner, Vaterstetten (DE); Walter Psyk, Munich (DE)

(73) Assignee: Schott Solar GmbH, Alzenau (DE)

( * ) Notice: Subject to any disclaimer, the term of this patent is extended or adjusted under 35 U.S.C. 154(b) by 0 days.

(21) Appl. No.: 12/321,453

(22) Filed: Jan. 21, 2009

(65) Prior Publication Data

US 2009/0191663 A1 Jul. 30, 2009

(30) Foreign Application Priority Data

Jan. 26, 2008 (DE) .................. 10 2008 006 166

(51) Int. Cl.
*H01L 21/00* (2006.01)
(52) U.S. Cl. .................. 438/65; 438/71; 438/73
(58) Field of Classification Search .................. 438/65, 438/71, 73; 257/E21.475
See application file for complete search history.

(56) References Cited

U.S. PATENT DOCUMENTS

| | | | |
|---|---|---|---|
| 4,292,092 A | 9/1981 | Hanak | |
| 4,650,524 A | 3/1987 | Kiyama et al. | |
| 4,892,592 A * | 1/1990 | Dickson et al. | 136/244 |
| 6,365,823 B1 * | 4/2002 | Kondo | 136/246 |
| 7,259,321 B2 | 8/2007 | Oswald et al. | |
| 2003/0044539 A1 | 3/2003 | Oswald | |
| 2004/0108199 A1 * | 6/2004 | Bramer et al. | 204/228.6 |
| 2007/0047600 A1 * | 3/2007 | Luo et al. | 372/21 |
| 2008/0089637 A1 * | 4/2008 | Farah | 385/14 |

FOREIGN PATENT DOCUMENTS

DE 31 21 350 C2 7/1982

* cited by examiner

*Primary Examiner*—William M. Brewster
(74) *Attorney, Agent, or Firm*—Flynn, Thiel, Boutell & Tanis, P.C.

(57) ABSTRACT

For producing a photovoltaic module (1), the front electrode layer (3), the semi-conductor layer (4) and the back electrode layer (5) are patterned by separating lines (6, 7, 8) to form series-connected cells ($C_1, C_2, \ldots C_n, C_{n+1}$) with a laser (14) emitting infrared radiation. During patterning of the semiconductor layer (4) and the back electrode layer (5) the power of the laser (14) is so reduced that the front electrode layer (3) is not damaged.

17 Claims, 2 Drawing Sheets

METHOD FOR PRODUCING A PHOTOVOLTAIC MODULE USING AN IR LASER

Figure 1:
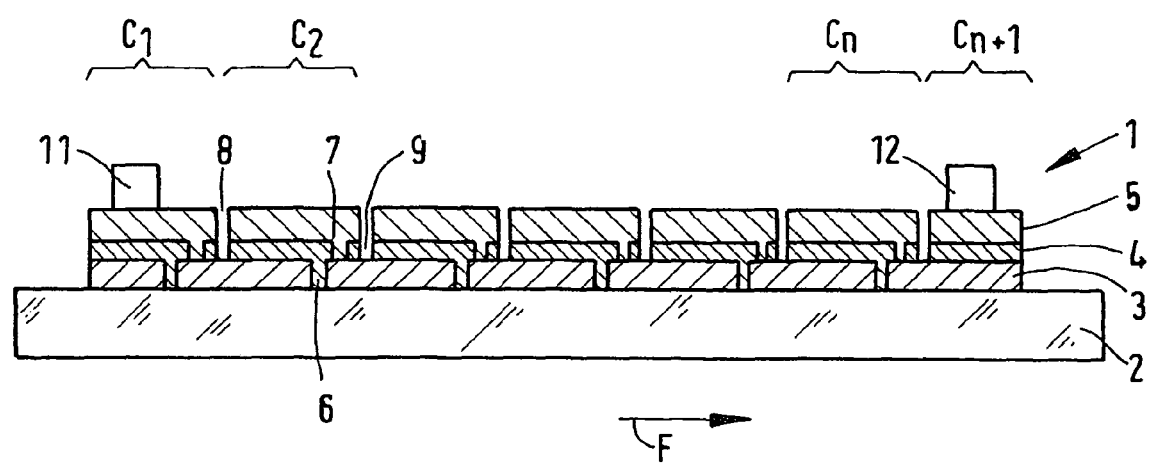

This invention relates to a method for producing a photovoltaic module according to the preamble of claim 1.

In the production of a photovoltaic module there are deposited over a large area on a transparent, electrically insulating substrate, for example a glass plate, three functional layers, namely, a transparent front electrode layer, a semiconductor thin-film layer and a back electrode layer.

To form series-connected cells from these monolithic layers, the layers are patterned by separating lines e.g. with a laser, by mechanical methods or by chemical means.

For patterning the front electrode layer, which consists for example of a transparent, electrically conductive metal oxide, for example tin oxide, it is customary to use laser technology. The laser used is typically a neodymium doped yttrium aluminum garnet (Nd:YAG) solid-state laser or yttrium vanadate (Nd:YVO$_4$) solid-state laser which emits infrared radiation with a wavelength of 1064 nm. At this wavelength the transparent tin oxide front electrode layer has an optical absorption of several percent.

The patterning of the semiconductor layer, for example a silicon thin film, is likewise typically done with laser technology. The laser used is a double-frequency Nd:YAG or Nd:YVO$_4$ solid-state laser which thus emits laser light with a wavelength of 532 nm in the visible range. At this wavelength the silicon thin film possesses high optical absorbance in comparison with the transparent front electrode layer. This permits selective ablation of the semiconductor layer without impairing the front electrode layer.

The patterning of the back electrode layer is done using mechanical methods, such as the "lift-off" technique wherein an adhesive paste is applied to the semiconductor layer in the areas where the back electrode layer is to be provided with separating lines and then stripped to remove the back electrode layer in said areas, but also using laser processes with a double-frequency Nd:YVO$_4$ or Nd:YAG laser with a wavelength of 532 nm.

When the separating lines have been formed with the laser in the semiconductor layer, the front electrode layer located therebelow is exposed. Upon subsequent deposition of the back electrode layer, the back electrode layer is thereby contacted with the front electrode layer, causing the cells of the photovoltaic module to be series-connected.

The production of the photovoltaic module requires a plurality of costly machines. The machine for semiconductor coating usually involves the highest investment costs. Also, the laser machines are important cost factors.

The capacity of the semiconductor coating machine and the capacity of the laser machines are usually different. Being the costliest machine, the semiconductor coating machine is generally utilized at a rate of 100% in the industrial production of photovoltaic modules.

If the semiconductor coating machine can for example perform at the most a coating of 210,000 modules a year, but each laser machine with a wavelength of 1064 nm or 532 nm is designed e.g. only for at most 90,000 modules a year, this has the consequence that altogether six costly laser machines must be procured because the capacity of two laser machines per stated wavelength and process for the front electrode and back electrode, at 180,000, does not suffice. The number of laser machines thus leads to a considerable cost problem in the industrial production of photovoltaic modules.

It is therefore the object of the invention to considerably reduce costs for the industrial production of photovoltaic modules.

This is achieved according to the invention by using the laser used for patterning the front electrode layer for patterning the back electrode layer as well.

For it has been ascertained that the back electrode layer can be removed with the semiconductor layer located therebelow, for example a silicon layer, by a laser even when the laser emits an infrared radiation that is absorbed by the transparent front electrode layer but not by the semiconductor layer.

For the absorption of the laser radiation by the front electrode layer has the consequence that the front electrode layer heats up through the laser radiation such that not only the semiconductor layer located thereabove is thermally removed and thus a patterning of the semiconductor layer by separating lines can be carried out, but when the semiconductor layer is coated with the back electrode layer, the semiconductor layer is thermally removed together with the back electrode layer and thus a patterning of the back electrode layer by separating lines is also possible. The process might also require a beam expander and a diaphragm or an optical beam conversion system, e.g. refractive or diffractive optic, which gives the laser beam a top-hat profile.

This does cause additional separating lines to be formed in the semiconductor layer upon patterning of the back electrode layer. However, said additional separating lines in the semiconductor layer have practically no effect on the power of the photovoltaic module.

It is essential, however, that when the laser is used for patterning the semiconductor layer and the semiconductor layer located therebelow, its power is so reduced that the front electrode layer is ideally not damaged, i.e. broken or otherwise impaired. This means that while the laser is used possibly at full power, but at least at high power, for patterning the front electrode layer, a relatively lower laser power is adjusted for patterning the back electrode layer with the semiconductor layer located therebelow.

Since the invention permits one and the same laser machine to be used both for patterning the front electrode layer and for patterning the back electrode layer with the semiconductor layer located therebelow, the invention permits the number of laser machines to be reduced in the industrial production of photovoltaic modules. This means that if, according to the example described at the outset, the semiconductor coating machine has a maximum capacity of 210,000 modules a year, it suffices to use five lasers with a maximum capacity of 90,000 modules a year each, so that one laser machine can be saved compared to the prior art.

If the laser patterning of the semiconductor layer is now also carried out at the wavelength 1064 nm with the Nd:YVO$_4$ or Nd:YAG solid-state laser, this being done at the wavelength 532 nm according to the prior art, and said lasers likewise have a maximum capacity of 90,000 modules a year, then two laser machines can be saved compared to the prior art. Thus, seven laser machines are then necessary for patterning front electrode, semiconductor and back electrode layers. According to the prior art, nine machines would be necessary in this example.

Likewise, according to the invention the redundancy of the laser patterning processes ensures substantially higher flexibility and total plant availability in production. In case of maintenance or malfunction of one laser patterning machine (for example for a front electrode layer) it is possible, due to the redundancy, for laser patterning machines for the back electrode (extended also for the semiconductor layer) to perform the processes for patterning the front electrode layer, or also additionally for patterning the semiconductor layer.

The front electrode layer can consist of an electrically conductive metal oxide, for example tin oxide ($SnO_2$), in particular fluorine doped tin oxide or another material. It is only essential that it is transparent and electrically conductive, absorbs at least part, preferably at least 0.5%, in particular at least 2%, of the emitted infrared radiation of the laser, and is thermally more stable than the back electrode layer with the semiconductor layer located therebelow.

Thus the separating lines are produced with the laser preferably at its full power for patterning the front electrode layer which was previously applied to the transparent substrate, for example a glass plate, e.g. by chemical vapor deposition.

On the patterned front electrode layer there is subsequently applied the semiconductor layer for example by chemical vapor deposition.

The semiconductor layer can consist of silicon, for example amorphous, nano-, micro- or polycrystalline silicon, but also of semiconductor, for example cadmium tellurium. The semiconductor layer can comprise silicon, for example amorphous, nano-, micro-or polycrystalline silicon, but also of other semiconductors, for example cadmium tellurium.

The back electrode layer is preferably a metal layer, consisting for example of aluminum, copper, silver or the like. It can be applied by sputtering. It is also possible to apply between the metal layer and the semiconductor layer, optionally also by sputtering, an interlayer which consists for example of a doped semiconductor, such as indium oxide, or aluminum doped zinc oxide, and which prevents metal atoms from diffusing out of the metal layer into the semiconductor layer of the module.

The laser used according to the invention emits infrared radiation, that is, radiation with a wavelength of at least 800 nm, preferably 1000 nm and more, in particular a solid-state laser emitting in the near infrared range being used. The solid-state laser can also be a fiber laser or a disk laser.

The solid-state laser is preferably a $Nd:YVO_4$ laser, i.e. it has yttrium vanadate as the host crystal. Instead, the host crystal can also be yttrium aluminum garnet (YAG) for example. For doping it is preferable to employ neodymium, i.e. to use a solid-state laser with a wavelength of 1064 nm. It is also possible to use erbium, ytterbium or another element for doping the laser. A neodymium doped yttrium vanadate laser ($Nd:YVO_4$ laser) or neodymium doped YAG laser (Nd: YAG laser) is particularly preferred.

For patterning the semiconductor layer the laser beam can be focused on the front electrode layer and semiconductor layer through the transparent substrate at the place where the separating lines are to be produced in the semiconductor layer. Instead it is also possible to perform the patterning of the semiconductor layer such that the laser beam is directed from the other side, i.e. directly onto the semiconductor layer.

It is thereby possible to produce in the semiconductor layer a separating line with a width of for example 10 to 100 µm which exposes the front electrode layer located therebelow. The semiconductor layer is subsequently coated with the back electrode layer for example by sputtering.

For patterning the back electrode layer the laser beam is focused through the transparent substrate onto the functional layers at the place where the separating lines are to be produced in the back electrode layer. It is thereby possible to produce in the back electrode layer a separating line with a width of for example 10 to 100 µm, which obtains the electrical isolation of the cells of the photovoltaic module that is necessary for the integrated series connection. As a side-effect, but not necessarily, the semiconductor thin-film layer is also removed completely or partly during this process.

The patterning of the back electrode layer is preferably done in pulsed mode, i.e. in particular in Q switch mode, in order to obtain separating lines with sharp edges in the back electrode layer. The pulsed mode is carried out here in combination with a beam expander and a diaphragm in the laser beam in order e.g. to form a "top-hat" shaped beam profile causing only the center of the laser beam to take effect. The optical devices, for example for beam expansion and the diaphragm or an optical beam conversion system (e.g. refractive or diffractive optic), are preferably adapted to be swiveled, or otherwise moved, out of the laser beam.

According to the invention, the energy of the laser is absorbed by the front electrode layer and transferred by heat conduction to the semiconductor thin-film layer with the back electrode layer located thereabove.

When the laser beam is coupled into the front electrode layer through the transparent substrate, e.g. the glass plate, to produce a separating line in the back electrode layer, the semiconductor layer is burned off together with the back electrode layer, i.e. removed thermomechanically.

Hereinafter the invention will be explained in more detail by way of example with reference to the enclosed drawing. Therein are shown schematically in longitudinal section:

FIG. 1 a photovoltaic module; and

FIGS. 2a to 2f the individual steps for producing the photovoltaic module according to FIG. 1.

According to FIG. 1, the photovoltaic module 1 has a transparent substrate 2, e.g. a glass plate, having deposited thereon, one on the other, three functional layers, namely, a transparent front electrode layer 3, a semiconductor thin-film layer 4 and a back electrode layer 5.

The module 1 comprises individual strip-shaped cells $C_1$, $C_2 \ldots C_n$, $C_{n+1}$ which are series-connected and extend perpendicular to the current flow direction F. For this purpose the front electrode layer 3 is interrupted, and thus patterned, by separating lines 6, the semiconductor layer 4 by separating lines 7, and the back electrode layer 5 by separating lines 8.

As explained hereinabove and again hereinafter with reference to FIGS. 2e and 2f, there also arise upon formation of the separating lines 8 in the back electrode layer 5 further separating lines 9 flush therewith in the semiconductor layer 4. However, the separating lines 9 are irrelevant to the functioning and effectiveness of the module 1.

According to FIG. 1, the back electrode layer 5 of one cell $C_1$, $C_n$ thus contacts the front electrode layer 3 of the adjacent cell $C_2$, $C_{n+1}$ through the separating line 7 in the semiconductor layer 4, thereby connecting the negative pole of one cell $C_1$, $C_n$ with the positive pole of the adjacent cell $C_2$, $C_{n+1}$.

The current produced by the photovoltaic module is collected by the contacts 11, 12 on the outermost cells $C_1$, $C_{n+1}$. On the back of the module 1 with the contacts 11, 12 there is provided a back protection (not shown) made of plastic or another electrically insulating material.

Figure 2A:
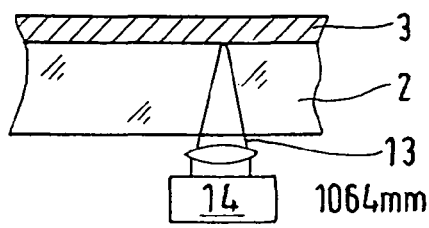
Figure 2B:
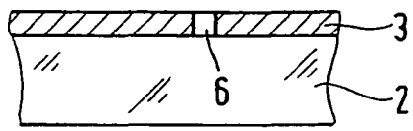
Figure 2C:
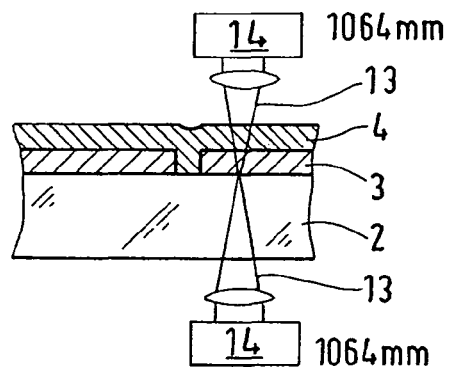
Figure 2D:
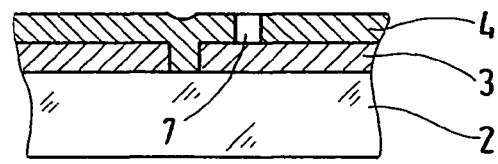
Figure 2E:
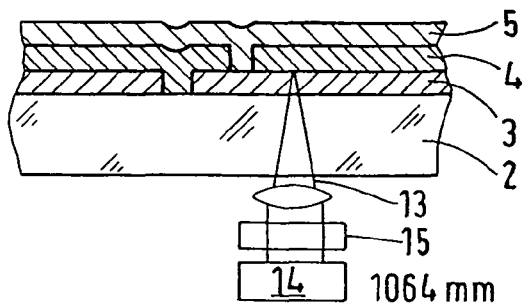
Figure 2F:
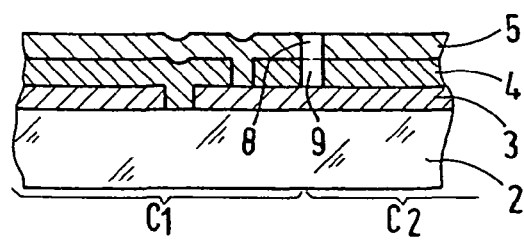

FIG. 2f shows the series connection of two adjacent cells by the example of the cells $C_1$ and $C_2$ according to FIG. 1. According to FIGS. 2a to 2f, the series-connected cells $C_1$ and $C_2$ are produced as follows.

Starting out from a glass substrate 2 coated with the front electrode layer 3, the separating lines 6 are produced with the focused laser beam 13 of the laser 14 which emits infrared radiation, for example a $Nd:YVO_4$ or Nd:YAG laser with a wavelength of 1064 nm, for patterning the front electrode layer 3 consisting for example of tin oxide, this happening through melting or evaporation of the front electrode layer 3 since the front electrode layer 3 absorbs the laser radiation of this wavelength.

In FIG. 2a the laser beam 13 is directed onto the front electrode layer 3 through the glass substrate 3. However, the patterning of the front electrode layer 3 can also be performed from the other side, i.e. with the laser beam directed onto the front electrode layer 3 directly.

On the thus formed patterned front electrode layer 3 according to FIG. 2b, the semiconductor thin-film layer 4, consisting for example of silicon, is deposited e.g. by chemical vapor deposition.

As shown in FIG. 2c, the laser 14 emitting the same infrared radiation, for example an Nd:YAG or Nd:YVO$_4$ laser with a wavelength of 1064 nm, is used for patterning the semiconductor layer 4, said laser being directed, i.e. focused, onto the two layers 3 and 4 in the area where the separating lines 7 are to be formed for patterning the semiconductor layer 4, either from the semiconductor layer side, as illustrated in FIG. 2c by the laser 14 disposed over the semiconductor layer 4, or through the glass substrate 2, as illustrated in FIG. 2c by the laser 13 disposed under the glass substrate 2.

Although the semiconductor layer 4 absorbs no, or very little, radiation of this wavelength, there is an absorption of the laser radiation 13 of the laser 14 by the front electrode layer 3 located therebelow, which thereby heats up thermally such that the thermally less stable semiconductor layer 4 is burned off, or in any case removed, so as to form the separating lines 7, thereby exposing the front electrode layer 3 in the area of the separating lines 7. To ideally avoid damaging the front electrode layer 3, the power of the laser 14 is accordingly reduced during this process.

On the glass substrate 2 coated with the patterned front electrode layer 3 and patterned semiconductor thin-film layer 4 according to FIG. 2d, the back electrode layer 5 consisting e.g. of metal is subsequently deposited for example by sputtering.

For patterning the back electrode layer 5 the laser 14 emitting the same IR radiation, e.g. the Nd:YVO$_4$ or Nd:YAG laser with a wavelength of 1064 nm, optionally with a swing-in optical device 15 (e.g. expander, diaphragm, refractive/diffractive optic), is used according to FIG. 2e, said laser being directed, i.e. focused, onto the layers 3, 4, 5 through the glass substrate 2 in the area where the separating lines 8 are to be formed for patterning the back electrode layer 5.

The semiconductor layer 4 absorbs no, or very little, radiation of this wavelength but there is an absorption of the laser radiation 13 of the laser 14 by the front electrode layer 3 located therebelow, which thereby heats up thermally such that the thermally less stable semiconductor layer 4 is burned off, in any case removed, so as to form the separating lines 7, thereby exposing the front electrode layer 3 in the area of the separating lines 7. To avoid damaging the front electrode layer 3, the power of the laser 14 is accordingly reduced during this process.

Although the back electrode layer 5 absorbs only part of this wavelength and the semiconductor layer 4 none or very little of the radiation of this wavelength, there is an absorption of the laser radiation 13 of the laser 14 by the front electrode layer 3 under the semiconductor layer 4, which thereby heats up thermally such that the thermally less stable semiconductor layer 4 and the back electrode layer 5 located thereabove is burned off, in any case removed, in this area so as to form the separating lines 8 in the back electrode layer 5 and the further separating lines 9 flush therewith in the semiconductor layer 4. To avoid damaging the front electrode layer 3, the power of the laser 14 is accordingly reduced during this process.

There thus do arise the additional separating lines 9 in the semiconductor layer 4 according to the inventive method. However, they do not lead to any noticeable impairment of the functioning or power of the photovoltaic module 1.

The invention claimed is:

1. A method for producing a photovoltaic module, wherein there are deposited as functional layers on a transparent substrate a transparent front electrode layer, a semiconductor layer and a back electrode layer which are patterned by separating lines to form series-connected cells, wherein a laser patterning of the three functional layers is performed, and a laser emitting infrared radiation performs laser patterning of the front electrode layer, laser patterning the semiconductor layer, and laser patterning the back electrode layer with the infrared radiation from the same laser, wherein in the laser patterning of the back electrode layer a single infrared beam patterns both the semiconductor layer and the back electrode layer while reducing the power of the laser during patterning of the back electrode layer so that the front electrode layer is not damaged, and wherein the patterning of the back electrode layer and the semiconductor electrode layer produces the same width of removed material and remains the same width.

2. The method according to claim 1, wherein the same laser used for patterning the front electrode layer and for patterning the back electrode layer emits infrared radiation to pattern the semiconductor layer.

3. The method according to claim 1, wherein the patterning is performed with a laser pulsed by an optoacoustical switch or Q switch (QS mode) and with an optical device comprising beam expansion, a diaphragm and/or refractive or diffractive optic in the laser beam.

4. The method according to claim 3, wherein the optical device permits a top-hat shaped beam profile to be obtained.

5. The method according to claim 3, wherein the optical device is adapted to be moved out of the laser beam.

6. A method for producing a photovoltaic module, wherein there are deposited as functional layers on a transparent substrate a transparent front electrode layer, a semiconductor layer and a back electrode layer which are patterned by separating lines to form series-connected cells, whereby a laser patterning of the three functional layers is performed, and a laser emitting infrared radiation is used for laser patterning of the front electrode layer, characterized in that the laser used for patterning the front electrode layer is also used for patterning the back electrode layer, wherein in the laser patterning of the back electrode layer a single infrared beam patterns both the semiconductor layer and the back electrode layer, the power of the same laser being so reduced during patterning of the back electrode layer and the semiconductor layer that the front electrode layer is not damaged, wherein the patterning of the back electrode layer produces the same width of removed material for the back electrode layer and the semiconductor electrode layer and remains the same width, characterized in that the laser has a wavelength at which the optical absorption of the front electrode layer is at least 0.5%.

7. The method according to claim 1, wherein the laser comprises a neodymium doped solid-state laser with a wavelength of 1064 nm.

8. The method according to claim 1, wherein the laser comprises an yttrium aluminum garnet solid-state laser or an yttrium vanadate solid-state laser.

9. The method according to claim 7, wherein the laser comprises a neodymium doped yttrium aluminum garnet laser or neodymium doped yttrium vanadate laser.

10. The method according to claim 1, wherein the laser beam is directed onto the three functional layers through the transparent substrate.

11. The method according to claim 2, wherein the laser emits infrared radiation at a single wavelength to pattern each of the functional layers.

12. A method for producing a photovoltaic module comprising the steps of:
   depositing a front electrode layer onto a substrate;
   applying a focused infrared laser beam with a laser machine at a predetermined wavelength to pattern the front electrode layer;
   depositing a semiconductor thin film layer onto the front electrode layer so that the thin film layer contacts the substrate at the pattern of the front electrode layer;
   applying a focused infrared laser beam with the same laser machine at the predetermined wavelength to heat the front electrode layer so that the semiconductor thin film layer is removed to form a pattern defined by separating lines that expose the front electrode layer;
   depositing a back electrode layer to the patterned semiconductor thin film layer so that the back electrode layer contacts the front electrode layer at the pattern of the semiconductor thin film layer; and
   applying a focused infrared laser beam with the same laser machine at the predetermined wavelength onto the front electrode layer, the semiconductor thin film layer and the back electrode layer through the substrate, the focused infrared beam heating the front electrode layer so that the thermally less stable thin film layer and the back electrode layer, which absorbs a part of the wavelength, are each removed to form a pattern through the back electrode layer and the thin film layer having the same width of removed material that remains the same width, wherein the focused laser beam is applied at less intensity than the laser beam intensity applied to pattern the front electrode layer,
   wherein the pattern extending inwardly beyond the back electrode layer and through the thin film layer has no significant effect on functioning or power output for a resulting photovoltaic module.

13. The method according to claim 12, wherein the predetermined wavelength is 1064 nm.

14. The method according to claim 12, wherein the step of applying a focused laser beam at a predetermined wavelength to pattern the front electrode layer, comprises applying the focused laser beam onto and through the substrate to remove a portion of the front electrode layer to form the pattern.

15. The method according to claim 12, wherein the separating lines formed in the back electrode have a width of 10 µm to 100 µm to obtain electrical isolation of the cells of the photovoltaic module.

16. The method according to claim 6, wherein the separating lines formed in the back electrode have a width of 10 µm to 100 µm to obtain electrical isolation of the cells of the photovoltaic module.

17. The method according to claim 1, wherein the separating lines formed in the back electrode have a width of 10 µm to 100 µm to obtain electrical isolation of the cells of the photovoltaic module.

* * * * *